US008076667B2

(12) United States Patent
Tansu et al.

(10) Patent No.: US 8,076,667 B2
(45) Date of Patent: Dec. 13, 2011

(54) EFFICIENT LIGHT EXTRACTION METHOD AND DEVICE

(75) Inventors: Nelson Tansu, Bethlehem, PA (US); Yik Khoon Ee, Bethlehem, PA (US); James F. Gilchrist, Allentown, PA (US); Pisit Kumnorkaew, Bethlehem, PA (US); Ronald A. Arif, Raleigh, NC (US)

(73) Assignee: Lehigh University, Bethlehem, PA (US)

( * ) Notice: Subject to any disclaimer, the term of this patent is extended or adjusted under 35 U.S.C. 154(b) by 346 days.

(21) Appl. No.: 12/520,619

(22) PCT Filed: Dec. 24, 2007

(86) PCT No.: PCT/US2007/088783
§ 371 (c)(1),
(2), (4) Date: Jun. 22, 2009

(87) PCT Pub. No.: WO2008/133756
PCT Pub. Date: Nov. 6, 2008

(65) Prior Publication Data
US 2009/0315013 A1    Dec. 24, 2009

Related U.S. Application Data

(60) Provisional application No. 60/871,823, filed on Dec. 24, 2006.

(51) Int. Cl.
*H01L 29/06* (2006.01)
(52) U.S. Cl. ............... 257/13; 257/14; 257/E33.067; 438/29

(58) Field of Classification Search ............... 257/13–14, 257/E33.067; 438/29
See application file for complete search history.

(56) References Cited

U.S. PATENT DOCUMENTS

| 4,986,635 A | 1/1991 | Spry |
| 5,204,284 A | 4/1993 | Kuo et al. |
| 6,309,459 B1 | 10/2001 | Yuge |
| 6,791,104 B2 | 9/2004 | Tansu et al. |
| 6,845,116 B2 | 1/2005 | Mawst et al. |

(Continued)

OTHER PUBLICATIONS

International Search Report from PCT/US2007/088778 by Tansu et al. (Jun. 13, 2008).

(Continued)

*Primary Examiner* — Matthew Smith
*Assistant Examiner* — Elias Ullah
(74) *Attorney, Agent, or Firm* — Saul Ewing LLP

(57) ABSTRACT

A tight emitting device comprises at least one p-type layer and at least one n-type layer and a microlens array surface. A method for improving light efficiency of a light emitting device, comprises depositing polystyrene microspheres by rapid convection deposition on surface of light emitting device; depositing a monolayer of close-packed $SiO_2$ microspheres onto the polystyrene microspheres; and heal treating to convert the polystyrene microspheres into a planar microlayer film to provide a surface comprising substantially two-dimensional (2D) hexagonal close-packed $SiO_2$ colloidal microsphere crystals partially imposed into a polystyrene monolayer film.

14 Claims, 5 Drawing Sheets

U.S. PATENT DOCUMENTS

| | | |
|---|---|---|
| 6,958,497 B2 | 10/2005 | Emerson et al. |
| 7,256,417 B2 | 8/2007 | Mawst et al. |
| 7,457,338 B2 | 11/2008 | Mawst et al. |
| 7,518,139 B2 | 4/2009 | Tansu et al. |
| 2003/0001168 A1 | 1/2003 | Tsuda et al. |
| 2003/0020085 A1 | 1/2003 | Bour et al. |
| 2005/0170167 A1 | 8/2005 | Kim et al. |
| 2005/0211993 A1 | 9/2005 | Sano et al. |
| 2006/0017061 A1 | 1/2006 | Sakamoto et al. |
| 2008/0144685 A1 | 6/2008 | Tansu et al. |

OTHER PUBLICATIONS

International Search Report from PCT/US2007/088783 by Tansu et al. (Sep. 19, 2008).

"Enhancement of light extraction efficiency of InGaN quantum wells light emitting diodes using SiO2/polystyrene microlens arrays" by Ee et al., Appl. Phys. Lett. 91, 221107 (2007).

"Polarization engineering via staggered InGaN quantum wells for radiative efficiency enhancement of light emitting diodes" by Arif et al., Appl. Phys. Lett. 91, 091110 (2007).

EFFICIENT LIGHT EXTRACTION METHOD AND DEVICE

CROSS REFERENCE TO RELATED APPLICATION

This application claims the benefit of U.S. Provisional Application No. 60/871,823, filed 24 Dec. 2006, which is incorporated herein by reference.

This invention was made with government support under Contracts Nos. W911NF-07-2-0064 and 07014121 respectively awarded by the Department of Defense—Army Research Lab and by the National Science Foundation. The government has certain rights in the invention.

BACKGROUND OF THE INVENTION

The invention relates to a light emitting device, particularly to an improved light extraction efficiency method and light emitting diode (LED).

A light-emitting diode is a semiconductor diode that emits incoherent narrow-spectrum light when electrically biased in the forward direction of a p-n junction. This effect is a form of electroluminescence.

An LED typically comprises a small area source, often with extra optics added to the chip that shapes its radiation pattern. Color of emitted light depends on semiconductor material composition and can be infrared, visible, or near-ultraviolet. The LED can comprise a chip of semiconducting material impregnated or doped with impurities to create the p-n junction. Charge-carriers—electrons and holes—flow into the junction from electrodes with different voltages. When an electron meets a hole, it falls into a lower energy level and releases energy in the form of a photon (light) causing current flow from the p-side, or anode, to the n-side, or cathode. The wavelength of the light emitted, and hence its color, depends on the band gap energy of the materials forming the p-n junction.

Refractive index of an LED package material should match the index of the semiconductor, otherwise produced light will be partially reflected back into the semiconductor, where it may be absorbed and turned into efficiency lowering heat. efficiency lowering reflection also occurs at the surface of the package if the LED is coupled to a medium with a different refractive index such as a glass fiber or air. The refractive index of most LED semiconductors is quite high, so in almost all cases tire LED is coupled into a much lower-index medium. The large index difference makes the reflection quite substantial (per the Fresnel coefficients), and both the Fresnel reflection and critical angle limitations are usually the dominant causes of LED inefficiency. Often more than half of emitted light is reflected back at the LED-package and package-air interfaces.

Several approaches have been implemented to improve light extraction efficiency of LEDs, such as: surface roughening, photonic crystals and nano-pyramids. The disadvantages of surface roughening are related to difficulty in controlling the process as well as in achieving good roughness repeatability. The photonic crystal and nanopyramid approaches require costly e-beam lithography, which are not applicable for large scale production of nitride LEDs.

A need continues for enhanced, inexpensive and repeatable LED light extraction efficiency.

BRIEF DESCRIPTION OF THE INVENTION

The invention provides enhanced and repeatable light emitting device extraction efficiency at a reasonable cost. The invention is describe in an embodiment as a light emitting device comprising at least one p-type layer and at least one n-type layer and a microsphere array surface.

Also, the invention is a method for improving light efficiency of a light emitting device, comprising: depositing polystyrene microspheres by rapid convection deposition onto a quantum well; depositing a monolayer of close-packed $SiO_2$ microspheres onto the polystyrene microspheres; and heat treating to convert the polystyrene microspheres into a planar microlayer film to provide a surface comprising substantially two-dimensional hexagonal close-packed $SiO_2$ colloidal microsphere crystals partially imposed into a polystyrene monolayer film.

Another embodiment is an optoelectronic device comprising: a multilayer semiconductor structure comprising a GaN layer and an active region, the active region comprising at least one quantum well layer of InGaN and GaN, wherein the electron quantum well layers and hole quantum well layer form a first quantum well stage, and wherein the active region comprises a plurality of quantum well stages adjacent to each other having the same structure as the first quantum well stage; and a microsphere array surface on the multilayer semiconductor.

In another embodiment, the invention is a method for making an optoelectronic device, comprising: providing a multilayer semiconductor structure comprising a GaN layer and an active region, the active region comprising at least one quantum well layer of InGaN and GaN, wherein the electron quantum well layers and hole quantum well layer form a first quantum well stage, and wherein the active region comprises a plurality of quantum well stages adjacent to each other having the same structure as the first quantum well stage; and depositing a microsphere array surface onto the multilayer semiconductor.

Still another embodiment is a method for generating optical emission from an optoelectronic device, comprising: providing a GaN layer and an active region, the active region comprising at least one quantum well layer of InGaN and GaN, wherein the electron quantum well layers and hole quantum well layer form a first quantum well stage, and wherein the active region comprises a plurality of quantum well stages adjacent to each other having the same structure as the first quantum well stage; depositing a microsphere array surface onto the GaN layer and an active region; and exciting the active region to produce optical emission.

DETAILED DESCRIPTION OF THE INVENTION

Figure 1:
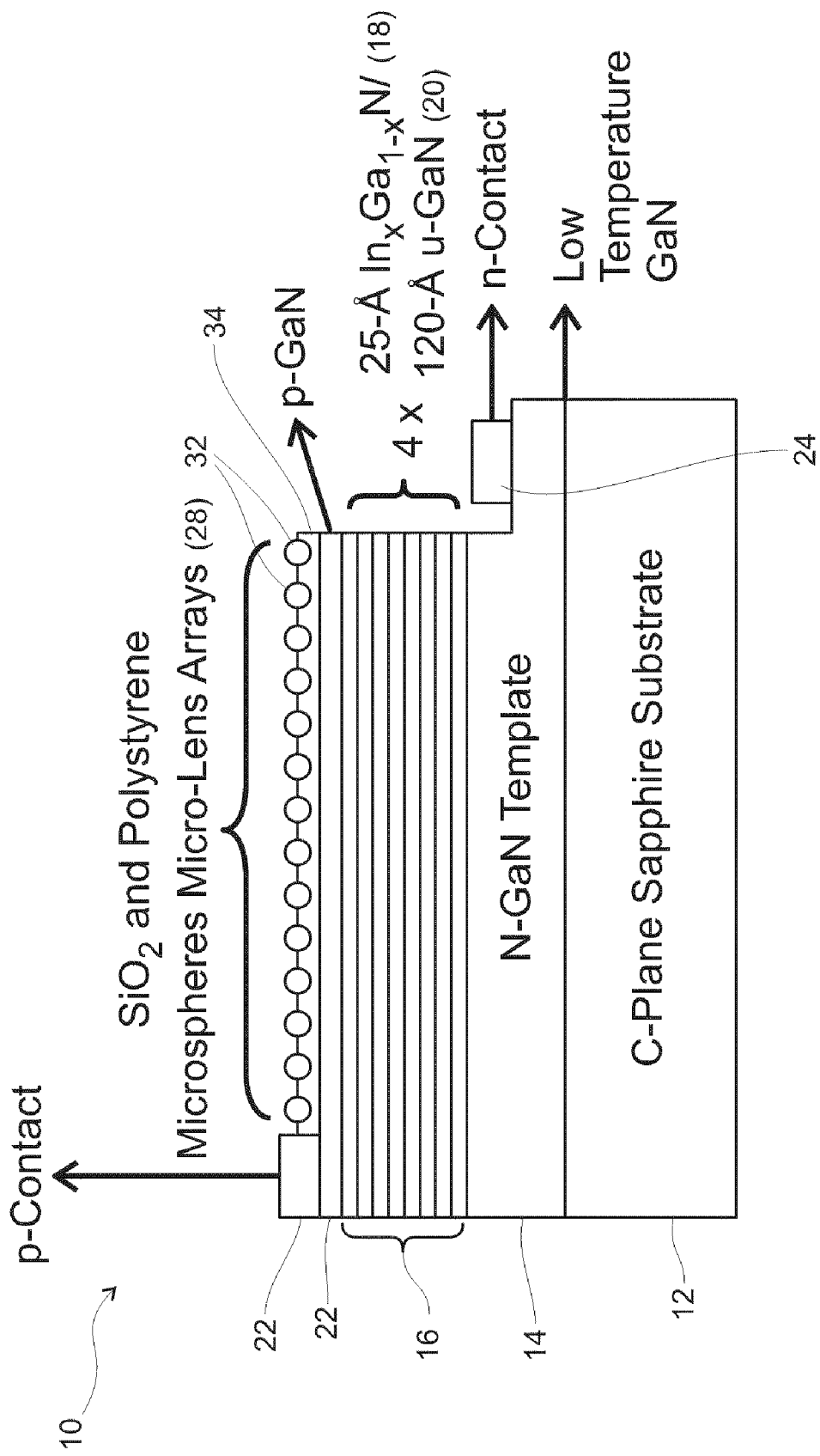
FIG. 1 is a schematic representation of an LED structure.

LED light extraction efficiency is the portion of emitted electromagnetic radiation that is transmitted usable for human vision. It is a ratio of emitted luminous flux to radiant flux. The present invention relates to an LED with improved light extraction efficiency.

An LED can comprise a chip of semiconducting material impregnated or doped with impurities to create a p-n junction. Current flows from the p-side or anode, to the n-side or cathode, but not in the reverse direction. Charge carriers—electrons and holes—flow into the junction from electrodes with different voltages. When an electron meets a hole, it falls into a lower energy level and releases energy in the form of a photon.

A quantum well is an LED potential well. The term "quantum well" or "QW" used herein refers to a thin-layer structure comprising alternate layers consisting of a first semiconductor layer with a thickness smaller than the de Broglie wavelength of about 200 Å to 300 Å with respect to electrons or holes and at least a second semiconductor layer with a band gap greater than that of the first semiconductor layer. A "substrate" is an underlying template or substratum can such as a sapphire template, GaN substrate, a Si substrate, SiC substrate or ZnO substrate.

A QW structure can be formed by sandwiching a semiconductor thin layer of a narrow band gap between semiconductor layers of a large band gap. If a single semiconductor thin layer constitutes a quantum well for both electrons and holes, the quantum well is called a type I quantum well. In this case, the semiconductor layer of a narrow band gap is called a well layer, and the semiconductor layers of a large band gap are called barrier layers. A type I multi-quantum well structure can be formed by alternately laminating semiconductor layers of narrow and broad band gaps. A type II quantum well structure has a first semiconductor layer forming a quantum well for electrons, a second semiconductor layer forming a quantum well for holes formed on the first semiconductor layer and third semiconductor layers sandwiching the first and second semiconductor layers as barrier layers to the electrons and holes. A type II multi-quantum well structure can be formed by alternately laminating first semiconductor layers, second semiconductor layers and third semiconductor layers.

In an embodiment, the invention relates to an optoelectronic device that includes a GaN layer and a quantum well active region with a microsphere array surface. The active region can comprise at least an InGaN hole quantum well layer and electron quantum well layers adjacent to the hole quantum well layer. At least one of the electron quantum well layers is GaN. The electron quantum well layers and hole quantum well layer form a first quantum well stage. The active region can include a plurality of the quantum well stages adjacent to each other having the same structure as the first quantum well stage. The structure can include a transitional layer of GaN between each quantum well stage.

A QW structure can be grown by III-V semiconductor MOCVD/MBE epitaxy and molecular beam epitaxy (MBE). However, for manufacturing considerations such as high-throughput, the use of metal organic chemical vapor deposition (MOCVD) growth may be preferred.

Quantum efficiency ($\eta_{EQE}$) of a QW depends on the injection efficiency ($\eta_{inj}$), radiative efficiency ($\eta_{rad}$), and light extraction efficiency ($\eta_{extraction}$). Low hole carrier mobility, challenges in p-type doping and polarization-induced electric fields impact the injection efficiency and radiative efficiency particularly of a III-Nitride LED. Large refractive index contrast at a GaN/air interface results in low light extraction efficiency.

Surface roughening has been implemented to improve the light extraction efficiency of an InGaN QW LED. The disadvantage of surface roughening is related to control and repeatability difficulties. Photonic crystal and micropyramid approaches have been proposed to improve light extraction efficiency. However, these approaches require e-beam lithography to obtain closely controlled dimensions, but, e-beam lithography is not applicable for low-cost and large scale production.

The invention provides an applied surface texture that improves light extraction efficiency of an LED. In an embodiment, the invention relates to an InGaN QW-based LED structure that utilizes $SiO_2$ microspheres to provide significantly improved light extraction efficiency. The $SiO_2$ microspheres provide a low-cost and straight-forward improvement in light extraction efficiency that eliminates the need for costly e-beam lithography.

The $SiO_2$ microsphere surface texturing can he formed by depositing PS microspheres onto a light emitting surface of the LED, depositing a monolayer of the $SiO_2$ microspheres and then heat treating to convert the PS to a planer microlayer. In one procedure, the PS microspheres are deposited by rapid convection deposition. The PS microspheres can be deposited in a suspension media such as water. The PS suspension can be a 5% up to 25% volume fraction PS in a suitable suspending media such as water. Preferably the PS volume fraction is 8% to 12% or about 10%. Suitable PS microsphere arrays are available from NanoLab, Inc., 55 Chapel Street, Newton, Mass. 02458. The microspheres can be deposited in a temperature range of 10 to about 50° C., preferably 20 to about 30° C.

Then a monolayer of close-packed $SiO_2$ microspheres is deposited as a suspension onto the PS microspheres. The $SiO_2$ suspension can be a 5% up to 25% volume fraction $SiO_2$ in a suitable suspending media such as water. Preferably the $SiO_2$ volume traction is 10% to 15% or about 13%. Suitable size spheres can be in the range from 0.05 microns up to 4 microns in diameter.

Suitable $SiO_2$ microspheres can be prepared for example, by hydrolysis of tetraethoxysilane or, by a sol gel process or by spray drying a colloidal silica gel. The microspheres can be deposited In a temperature range of 10 to about 50° C., preferably 20 to about 30° C. Suitable size spheres can be in the range from 0.05 microns up to 4 microns in diameter, preferably 0.1 micron to 2 microns. Suitable $SiO_2$ microspheres are available from Bangs Laboratories, Inc., 9025 Technology Drive, Fishers, Ind. 46038-2886 and are available in quantities with a standard size deviation of less than 1%.

Then the $SiO_2$/PS is heat treated to convert the polystyrene microspheres into a planar microlayer film to provide a surface comprising substantially two-dimensional hexagonal close-packed $SiO_2$ colloidal microsphere crystals partially imposed into a polystyrene monolayer film. The heat treatment can be conducted at a temperature in the range of 120° to 200° C. preferably 130° to 150° C. The resulting film thickness can be in the range of 0.01 micron up to about 3 micron.

The invention may be embodied in various types of optoelectronic devices including amplifiers, light emitting diodes and edge emitting and surface emitting lasers that incorporate optical feedback to provide lasing action. The invention may find application in solid state lighting, solid state displays, lasers, light emitting diodes (LEDs), biomedical therapy and diagnostic devices, medical lasers, eye surgery devices and DVD lasers.

The invention provides an InGaN quantum well LED structure utilizing a $SiO_2$/polystyrene (PS) microsphere array that enhances light extraction efficiency from a top surface of an LED. The dimensions of the $SiO_2$ microspheres can be from 0.1 μm to 2 μm, preferably from 0.25 μm to 1 μm. Microsphere size can be controlled accurately to provide roughening repeatability. The $SiO_2$ spheres exhibit good adhesion to III-V materials. The spheres and are transparent to light emission from InGaN LEDs. The deposition of substantially two dimensional close-packed $SiO_2$ colloidal crystals is simple and quick compared to electron-beam lithography or to complex wafer fabrication techniques. The $SiO_2$ microspheres can be coated to the LED top emission area to avoid detrimental influence on the I-V characteristics of the LED.

These and other features of the invention will become apparent from the drawings and following detailed discussion, which by way of example without limitation describe preferred embodiments of the invention.

EXAMPLES

In these EXAMPLES, a layer of polystyrene (PS) and a monolayer of two-dimensional hexagonal close-packed $SiO_2$ colloidal crystal were deposited on a top surface of an InGaN QW-based device. FIG. 1 illustrates the LED device 10 including a 3-μm GaN template 14 (grown at 1080° C.) on c-plane sapphire substrate 12 using a low-pressure vertical-type MOCVD system, employing a low temperature buffer layer of 30-nm GaN (grown at 535° C.). Active region 16 of the device structure comprised 4-period 2.5-nm InGaN QWs 18 and 12-nm GaN barriers 20. The device 10 included p-GaN layer 22, n-contact 24 and p-contact 26 as shown.

Figure 2:
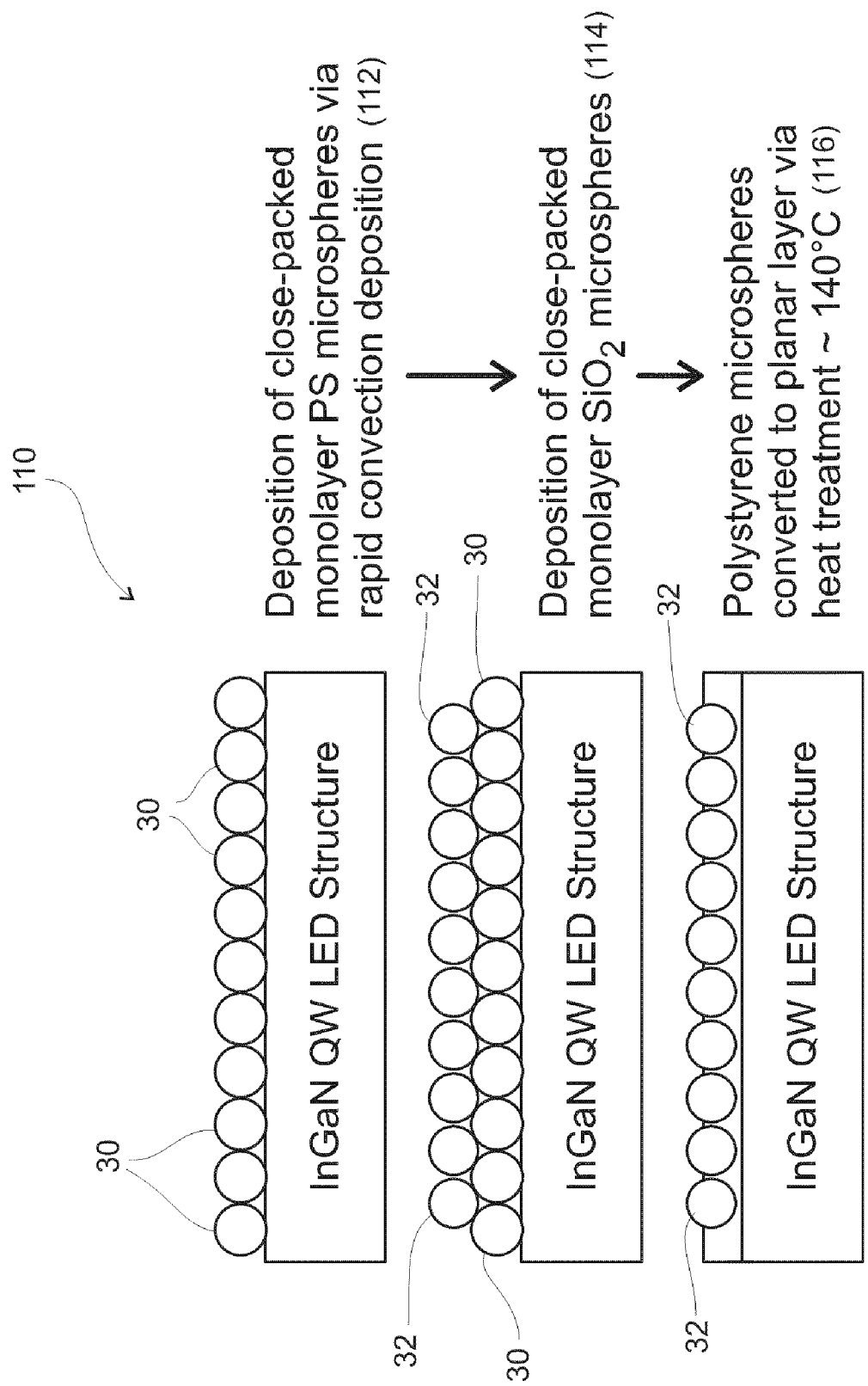
FIG. 2 is a process flow schematic.

The LED device 10 included a microlens array surface 28 comprising $SiO_2$ microspheres 32 imbedded in a polystyrene monolayer film 34 prepared In accordance with the process illustrated in FIG. 2. The $SiO_2$ microspheres 32 with diameter of 1.0 μm were semi-buried in the PS film 34, thereby forming a close-packed lens-like array 28. The refractive index of GaN in the visible spectrum is 2.5, while the refractive indices of a PS film 34 and $SiO_2$ microspheres 32 are 1.58 and 1.46, respectively. The array 28 on the top surface of the LED 10 allowed photons emanating from the QW to scatter out from the LED 14 structure with larger 'effective' photon escape cone, thus leading to increase in the device external quantum efficiency, as hereinafter described in detail.

FIG. 2 schematically represents a process 110 of depositing a PS film 34 and monolayer of two-dimensional hexagonal close-packed $SiO_2$ colloidal crystals 32. In FIG. 2, polystyrene spheres 30 were deposited by rapid convection deposition 112. Then a monolayer of close-packed $SiO_2$ microspheres 32 was deposited 114 onto the PS microspheres 30. Finally the PS microspheres 30 were converted 116 to a planar microlayer film 34 via heat treatment at 140° C. The final surface comprised substantially two-dimensional hexagonal close-packed $SiO_2$ microsphere crystals 32 partially imposed into a planar PS microlayer film 34 as shown in 3A and 3B.

In the FIG. 2 process, volume fractions of a 1.0 μm-diameter PS suspension and a $SiO_2$ microsphere suspension were 10% and 13%, respectively.

A droplet volume of a 10 μL PS colloid suspension was injected onto the InGaN QW LED sample. The volume used was just sufficient to cover the sample surface, about 10 microliters. A leveler (a deposition glass plate in this EXAMPLE) was swiped across the suspension at an angle of 25°±1° controlled by a linear motor at a speed of 45 μm/s. After depositing one ML of PS microspheres 30, the process was repeated to deposit one ML of $SiO_2$ microspheres 32 onto the PS microspheres. The coated samples were then heated using a hotplate at 140° C. to melt the PS microspheres 30, thereby capturing the $SiO_2$ microspheres 32 in a planar PS film 34 without significant rearrangements to the $SiO_2$ packing structure.

Photoluminescence (PL) and LED test samples were grown using a vertical-type metalorganic chemical vapor deposition (MOCVD) reactor. The PL samples were grown on a 3-μm u-GaN template on c-plane sapphire at a temperature of 1080° C., employing a low temperature 30-nm u-GaN buffer layer. The PL structure was then grown on top of the u-GaN template. Active regions consisted of four-period 2.5-nm InGaN QW and 12-nm GaN barriers, grown at a temperature of 710° C. The In-content of the InGaN QW of the PL sample was found as 12%, as calibrated via X-ray diffraction.

In-content of the investigated GaN QW 10 ranged from 12% up to 20%, calibrated via X-ray diffraction. The n-GaN layer 14 was Si-doped at a level of ~$2\times10^{18}$ $cm^{-3}$. The PL samples did not employ p-GaN 22. The p-GaN 22 was grown utilizing 50-nm Mg-doped GaN at growth temperature of 970° C., followed by $N_2$ activation annealing at a temperature of 780° C. for a duration of 5 min.

The ex-situ rapid convective deposition of the microsphere layers from colloidal suspensions was subsequently conducted on top of each of the InGaN QW PL and LED samples. Strong capillary forces at a meniscus between a substrate and a colloidal suspension induced crystallization of spheres into a 2D array. The use of colloidal self-assembly exploits the tendency of monosized sub-micrometer spheres to spontaneously arrange into a close-packed 2D crystal.

Figure 3A:
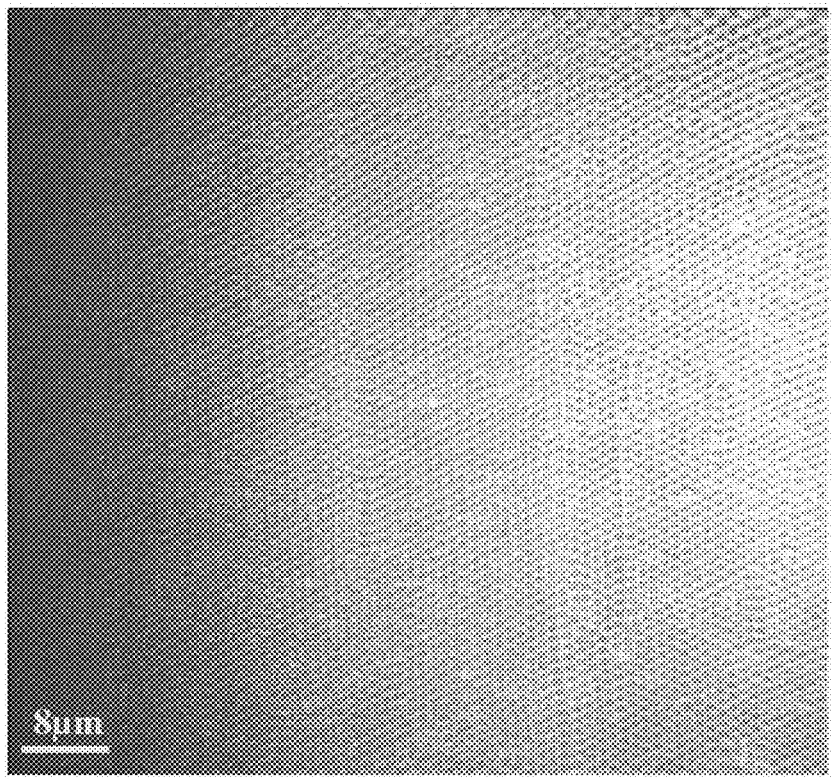
FIG. 3A is a confocal laser scanning microscopy image and FIG. 3B is a scanning electron microscopy image.
Figure 3B:
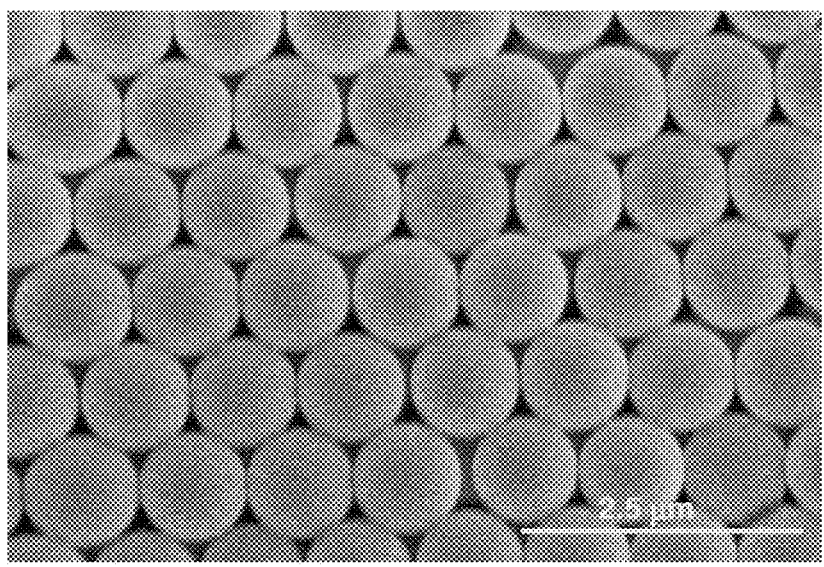

The $SiO_2$ microspheres 32 were semi-buried in the PS film 34, forming a hexagonal close-packed $SiO_2$/PS microlens array 28. FIG. 3A and FIG. 3B are confocal laser scanning microscopy and scanning electron microscopy images of the $SiO_2$/PS microlens array 28 on top of the GaN layer of the LED structure. The scanning microscopy image shows substantially close packed $SiO_2$ microspheres 32. As illustrated in FIG. 3B, the $SiO_2$ colloidal crystal forms a 2D hexagonal closed-packed microlens array 28. The spherical $SiO_2$ microspheres 32 had diameters of 0.8-1.0 μm and were close-packed and semi-buried in the PS. Substantially close packed means that the microspheres were arranged as a lattice of spheres that substantially took up the greatest possible fraction of a 2-dimensional plane. The close-packed $SiO_2$ microspheres 32 imparted a controlled surface roughness that allowed light rays emanating from the QW to diffuse out from the LED 10 thus leading to increased external quantum efficiency.

PL comparison studies were conducted on $In_{0.12}Ga_{0.88}N$ QW samples emitting with peak wavelength ($\lambda_{peak}$) at 419.3-nm. The PL measurements were conducted on samples (grown at the same time) with and without the microlens array 28, utilizing an He—Cd excitation laser (λ=325-nm) from the backside of the samples at room temperature. PL luminescence was collected from the top surface of the samples.

Figure 4:
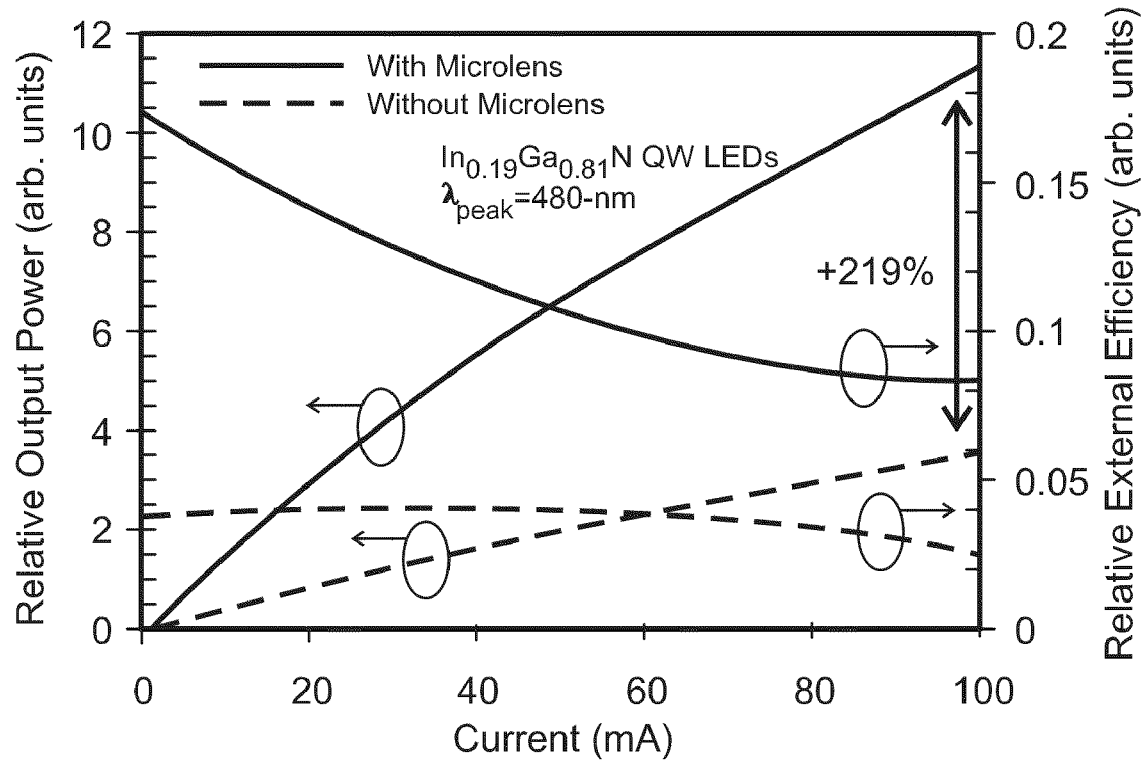
FIG. 4 is a graph of photoluminescence (PL)

FIG. 4 shows the PL spectra of the $In_{0.12}Ga_{0.88}N$ QW PL samples with and without the microlens array. PL luminescence peak intensity of the samples covered with microlens array 28 exhibited 233.6% improvement over that of samples without microlens array. Integrated PL luminescence for samples with the microlens array 28 also showed 269.7% improvement over that of an uncoated sample. The multi-peaked emission of the PL spectra for the uncoated sample is an artifact of the Fabry-Perot cavity effect in the cavity formed by sapphire/GaN/air, resulting in interference effect. The microlens array 28 on the top surface of the sample scattered the emitted photons from the active media, resulting in suppression of the Fabry-Perot cavity effect.

The $SiO_2$/PS microlens array was deposited on an LED sample, employing 4-period of 2.2 nm±0.15 nm thick (calibrated via transmission electron microscopy) $In_{0.19}Ga_{0.81}N$ QWs with GaN barriers, emitting with $\lambda_{peak}$=480 nm. In-content of the InGaN QW of the LED sample was found as 19%±1%, as calibrated via X-ray diffraction. The LED structure was grown on a 3.0-μm n-GaN template on c-plane sapphire substrate. The n-GaN was Si-doped with n-doping level of $2\times10^{18}$ $cm^{-3}$. The p-GaN was grown utilizing 80-nm thick Mg-doped GaN (p-doping=3×10$^{17}$ cm$^{-3}$) at growth temperature of 970° C., followed by N$_2$ annealing at a temperature of 780° C. for a duration of 5 minutes.

Figure 5:
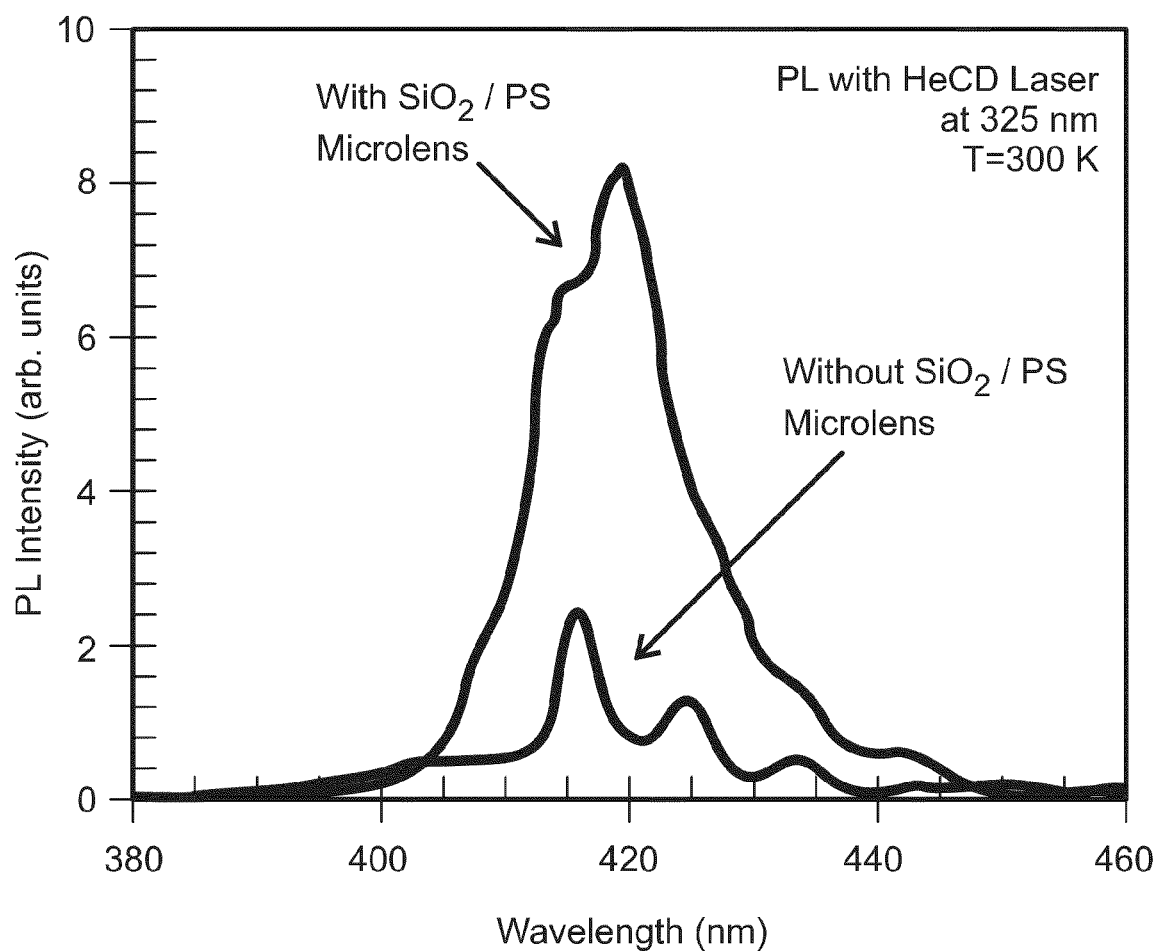
FIG. 5 is a graph showing a power and current comparison.

Continuous wave (CW) power measurements were performed at room temperature for LED devices with and without the SiO$_2$/PS microlens array 28. On-wafer power measurement was done in a light proof dark chamber, using large-area planar-diffused silicon photodiode, and a benchtop optical power meter. FIG. 5 shows the output power as a function of the driving current for up to 100 mA for both LEDs with an area of 1 mm$^2$. The CW power-current measurements exhibit 219% improvement in the output power of the LED device with SiO$_2$/PS microlens array 28 at a current level of 100 mA, as compared to that without microlens array.

The current invention provides a significant increase in LED output power. While there is no intention to be bound by the following explanation, it is believed that the increase in the output power of inventive microlens LED is attributable to an increase in an effective photon escape cone between emitter and air. Escape cone is a virtual cone defined by a critical angle ($\theta_c$) of impact of a photon at an Interface. The critical angle defines a limit to the escape of incident photons from an emitter. Photons that are Incident to the interface at angle $\theta_c$ or less, escape from the emitter while photons that are incident at a greater than $\theta_c$ angle are reflected back into the emitter where they may be lost by absorption. See Pocius et al., 6987613, incorporated herein by reference in its entirety. The inventive SiO$_2$/PS film serves as an intermediate refractive index material that provides multiple angles of incidence. The multiple angles of incidence of the curved hemispheric SiO$_2$ surfaces provide increased opportunities (as compared to a flat surface) for photon escape, thereby expanding the effective photon escape cone between emitter and air.

In addition to increase in effective photon escape cone, the use of SiO$_2$ (n=1.46)/PS (n=1.58) as the intermediate refractive index materials for the microlens array also leads to reduced Fresnel reflection in the GaN/PS/SiO$_2$/air interface by as high as 4.7% for normal incidence, as compared to that for GaN/air interlace. The Fresnel reflection for GaN/PS/SiO$_2$/air interface was calculated using transfer matrix propagation matrix method for normal incidence.

Relative external quantum efficiency as a function of injection current of the LED was obtained by differentiating the relative output power with the injection current. As shown in FIG. 5, there was an overall improvement in the relative external quantum efficiency of LEDs with SiO$_2$/PS microlens array 28 as compared to that of the LEDs without the microlens array. At low current level (I=5 mA), the improvement of LED efficiency with microlens array was about 4.34 times. The improvement in the relative external quantum efficiency of 3.32 times was observed for LEDs with microlens at current level of 100 mA. This reduction in the improvement in LEDs with microlens array at high current level can be attributed to the thermal effect. The proof-of-concept experiments show promising results, and further understanding and optimization on the thermal distribution of the LEDs with microlens array are still required.

The EXAMPLES demonstrate enhancement of light extraction efficiency of InGaN QW LEDs by using SiO$_2$/PS microspheres. The utilization of SiO$_2$ microspheres led to enhancement of ~3.3 and ~4.3 times the peak luminescence intensity and the integrated luminescence of the InGaN QW LEDs. Improvement of output power by ~232% for the LEDs with coated microspheres was also observed. This low-cost and controllable microsphere process provides a method for enhancing the light extraction LED efficiency.

Utilization of SiO$_2$/PS microspheres deposited via rapid convective deposition on InGaN QW PL sample led to improvement of 233.6% and 269.7% for its peak luminescence intensity ($\lambda_{peak}$=419.3-nm) and integrated luminescence. Improvement of output power by 219% (at current level of 100 mA) for the electrically-injected InGaN QW LEDs emitting with $\lambda_{peak}$=480 nm with microlens array was also obtained, presumably due to the increase in the effective photon escape cone and reduced Fresnel reflection.

The process of forming the array provides adequate adhesion to III-Nitride materials at room temperature. The array materials are relatively transparent to visible light emission from the InGaN QW. Also, the deposition of 2D close-packed SiO$_2$/PS colloidal crystal is practical and straight forward, as compared to e-beam lithography or complex wafer fabrication techniques. As the SiO$_2$ microspheres are deposited as a final step on the top emission area of the LEDs, this approach avoids any degradation on the electrical characteristics of the LEDs.

While preferred embodiments of the invention have been described, the present invention is capable of variation and modification and therefore should not be limited to the precise details of the Examples. The invention includes changes and alterations that fall within the purview of the following claims.

What is claimed is:

1. A method for improving light efficiency of a light emitting device, comprising:
    depositing polystyrene microspheres by rapid convection deposition on the top surface of light emitting device;
    depositing a monolayer of close-packed SiO$_2$ microspheres onto the polystyrene microspheres; and
    heat treating to convert the polystyrene microspheres into a planar microlayer film to provide a surface comprising substantially two-dimensional hexagonal close-packed SiO$_2$ colloidal microsphere crystals partially imposed into a polystyrene monolayer film.

2. The method of claim 1, comprising providing a semiconductor substrate; and forming on the substrate a succession of layers to provide a QW comprising at least one InGaN layer and at least one InGaN layer adjacent a GaN barrier layer; and depositing the polystyrene microspheres onto a structure comprising the formed QW.

3. The method of claim 1, comprising forming a SiO$_2$ microsphere suspension.

4. The method of claim 1, comprising;
    forming a 1.0 μm-diameter polystyrene suspension;
    depositing a droplet volume of the polystyrene suspension between a InGaN QW LED sample; and
    sweeping a deposition plate at an angle of 25°±1° to the deposited droplet volume of polystyrene to form the film.

5. The method of claim 1, comprising forming on the substrate a succession of layers to form an inner contact layer and a multiple quantum well stack comprising the active region, and an outer contact layer.

6. The method of claim 1, wherein the heat treating is at a temperature in the range 120° to 200° C.

7. The method of claim 1, wherein the heat treating is at a temperature in the range 130° to 150° C.

8. The method of claim 1, wherein the close-packed SiO$_2$ microspheres are deposited as a 5% to 25% volume fraction suspension.

9. The method of claim 1, wherein the close-packed SiO$_2$ microspheres are deposited as a 10% to 15% volume fraction suspension.

10. The method of claim 1, wherein polystyrene microspheres are deposited as a 5% up to 25% volume fraction suspension.

11. The method of claim 1, wherein polystyrene microspheres are deposited as a 8% to 12% volume fraction suspension.

12. The product of the process of claim 1.

13. A method for making an optoelectronic device, comprising:

providing a multilayer semiconductor structure comprising a GaN layer and an active region, the active region comprising at least one quantum well layer of InGaN and GaN, wherein the electron quantum well layers and hole quantum well layer form a first quantum well stage, and wherein the active region comprises a plurality of quantum well stages adjacent to each other having the same structure as the first quantum well stage; and depositing a polystyrene microsphere array surface onto the multilayer semiconductor structure; depositing close-packed $SiO_2$ microspheres onto the polystyrene microsphere array surface; and heat treating to convert the polystyrene microsphere array surface into a microlayer film to provide a surface comprising close-packed $SiO_2$ colloidal microsphere crystals partially imposed into a polystyrene monolayer film.

14. A method for generating optical emission from an optoelectronic device, comprising:

providing a GaN layer and an active region, the active region comprising at least one quantum well layer of InGaN and GaN, wherein the electron quantum well layers and hole quantum well layer form a first quantum well stage, and wherein the active region comprises a plurality of quantum well stages adjacent to each other having the same structure as the first quantum well stage;

depositing a polystyrene microsphere array surface onto the active region;

depositing close-packed SiO2 microspheres onto the polystyrene microsphere array surface;

heat treating to convert the polystyrene microsphere array surface into a microlayer film to provide a surface comprising close-packed SiO2 colloidal microsphere crystals partially imposed into a polystyrene monolayer film; and exciting the active region to produce optical emission.

* * * * *